(12) United States Patent
Saxena et al.

(10) Patent No.: US 10,529,631 B1
(45) Date of Patent: Jan. 7, 2020

(54) TEST STRUCTURES AND METHOD FOR ELECTRICAL MEASUREMENT OF FINFET FIN HEIGHT

(71) Applicant: PDF Solutions, Inc., San Jose, CA (US)

(72) Inventors: Sharad Saxena, Richardson, TX (US); Jianjun Cheng, San Jose, CA (US); Yuan Yu, San Jose, CA (US)

(73) Assignee: PDF SOLUTIONS, INC., San Jose, CA (US)

(\*) Notice: Subject to any disclaimer, the term of this patent is extended or adjusted under 35 U.S.C. 154(b) by 95 days.

(21) Appl. No.: 15/269,854

(22) Filed: Sep. 19, 2016

Related U.S. Application Data

(60) Provisional application No. 62/220,150, filed on Sep. 17, 2015.

(51) Int. Cl.
*H01L 29/66* (2006.01)
*H01L 21/66* (2006.01)

(52) U.S. Cl.
CPC ........ *H01L 22/20* (2013.01); *H01L 29/66795* (2013.01)

(58) Field of Classification Search
CPC ....... H01L 29/78; H01L 21/66; H01L 27/108; H01L 21/8242
See application file for complete search history.

(56) References Cited

U.S. PATENT DOCUMENTS

| | | | | |
|---|---|---|---|---|
| 5,256,588 A | * | 10/1993 | Witek | .............. H01L 27/10864 257/E21.652 |
| 9,972,550 B2 | * | 5/2018 | Nowak | .................... H01L 22/34 |
| 2010/0073993 A1 | * | 3/2010 | Baker | ...................... G11C 5/04 365/148 |
| 2010/0254186 A1 | * | 10/2010 | Tang | ..................... H01L 27/108 365/182 |
| 2013/0228778 A1 | * | 9/2013 | Tsai | ....................... G01B 7/082 257/48 |
| 2014/0282326 A1 | * | 9/2014 | Chen | ................... G06F 17/5081 716/111 |

\* cited by examiner

*Primary Examiner* — Evren Seven
(74) *Attorney, Agent, or Firm* — Pillsbury Winthrop Shaw Pittman LLP

(57) ABSTRACT

Methods of measuring fin height electrically for devices fabricated using FinFET technology are disclosed here. One method uses an interleaving comb-like test structure with no gate. The other method extracts fin height from total gate capacitance from FinFETS with varying gate lengths. When a comb-like structure with no gate is used to measure fin height, if there is another structure with a gate is used, then the gate capacitance may be measured to independently measure thickness of gate dielectric.

16 Claims, 3 Drawing Sheets

Epi blocked

US 10,529,631 B1

TEST STRUCTURES AND METHOD FOR ELECTRICAL MEASUREMENT OF FINFET FIN HEIGHT

RELATED APPLICATIONS

This application claims the benefit of U.S. Provisional Patent Application Ser. No. 62/220,150 filed Sep. 17, 2015 and is incorporated herein in its entirety.

BACKGROUND OF THE INVENTION

Field of the Invention

This disclosure relates to electrical measurement of integrated circuit components, specifically measuring fin height of FinFET devices.

Brief Description of the Prior Art

FinFETs represent a recent generation of CMOS technology, and overcome many limitations of CMOS scaling by providing better electrostatic control compared to planar MOSFETs. However, the technology for manufacturing FinFETs introduces many new sources of variation. One such source of variation is fin-height. Since fin-height defines the transistor drive strength variation in fin-height translates directly in variation on transistor performance. Moreover, variation in fin height changes various components of transistor capacitance, which adds an additional source of variation during product performance. Control of fin height during manufacturing requires a fast and efficient method to measure fin-height.

The best known methods to measure fin height in FinFET devices are through optical techniques such as scatterometry. The main limitation of these approaches is the throughput. This limits the number of measurements that can be taken during manufacturing and therefore it does not provide sufficient spatial or temporal data for effective control. Another approach is to estimate gate height from resistance of gate material on long gate lengths. Many factors impact this resistance, including gate patterning, gate material properties, gate height etc. This makes estimation of fin height error prone.

SUMMARY

Methods of measuring fin height electrically for devices fabricated using FinFET technology are disclosed here. One method uses an interleaving comb-like test structure with no gate. The other method extracts fin height from total gate capacitance from FinFETS with varying gate lengths. When a comb-like structure with no gate is used to measure fin height, if there is another structure with a gate is used, then the gate capacitance may be measured to independently measure thickness of gate dielectric. The test structures may be disposed on the same wafer on which FinFETs are fabricated, or the test structures may be on a dedicated test wafer that is measured in parallel with the IC wafer during fabrication.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION OF THE EMBODIMENTS

Embodiments of the present invention will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

Described are methods of measuring fin height electrically, with reference to two preferred methods: one with no gate, and the other with varying length of gate. Metrology or test structures are used to measure FinFET dimensions. The test structures may be disposed on the same wafer on which FinFETs are fabricated, or the test structures may be on a dedicated test wafer that is measured in parallel with the IC wafer during fabrication.

Figure 1A:
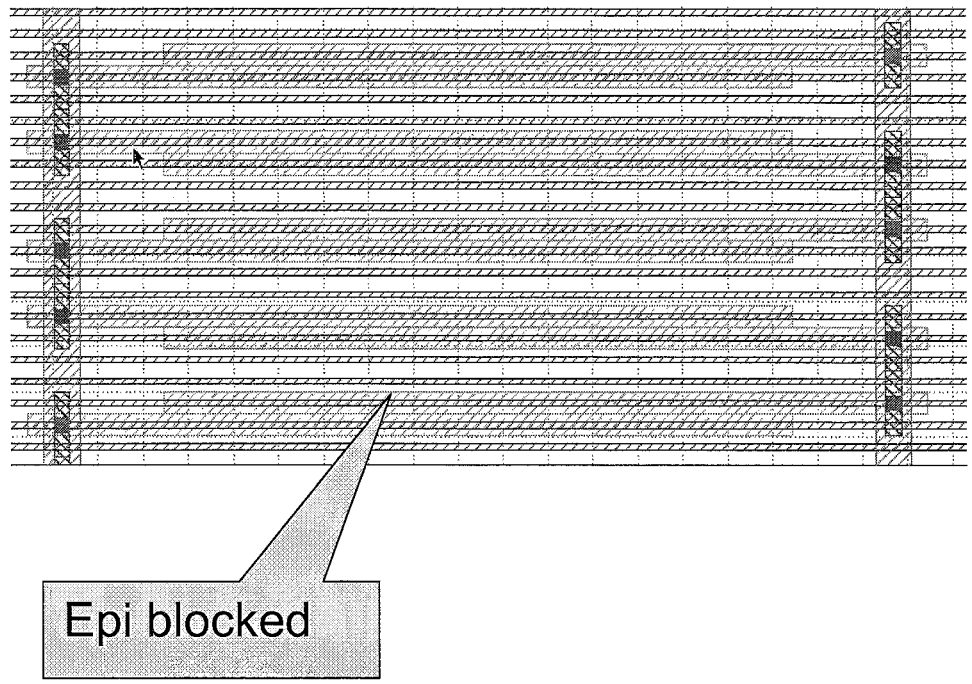
FIG. 1(a)-(b) illustrate test structure with interleaving combs of fins, and no gate, that is to be used for the first method of fin height extraction, according to an embodiment.
Figure 1B:
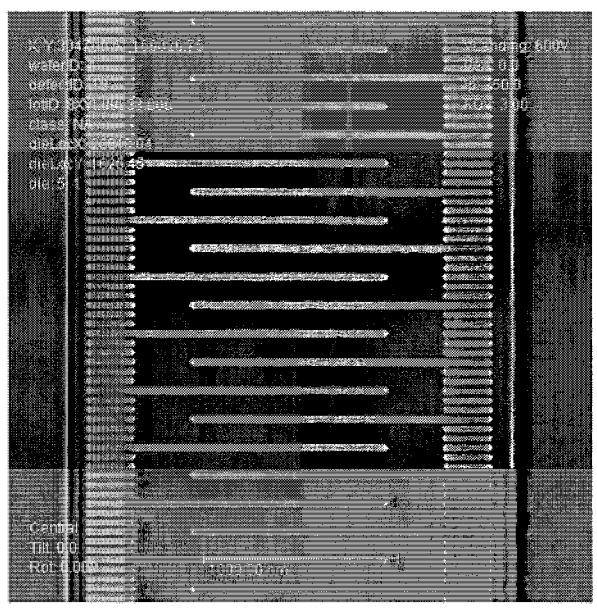

The first method utilizes the test structure shown in FIGS. 1(a)-(b). For technologies that merge source and drain by epitaxial Si during contact formation, this structure blocks the epi growth. FIG. 1 shows top view of both a design of the test structure (FIG. 1(a)) as well as a fabricated version of the test structure (FIG. 1(b)). The test structure comprises two interleaved combs of fins with no gate. Here, fin-to-fin capacitance is measured. The capacitance of the two combs is proportional to the fin height. The measured capacitance can be used directly as a monitor of fin height or can be converted to a fin height if the dielectric constant of the dielectric between the fins is known. The benefit of this approach is that it is not impacted by gate leakage, which would be the case if there are gates on the fins. Since fin height is obtained from independent measurement, a gate capacitance measurement from a second structure can be used as an orthogonal measurement to extract another dimension, such as thickness of the gate dielectric layer (e.g. oxide layer thickness at inversion).

Figure 2:
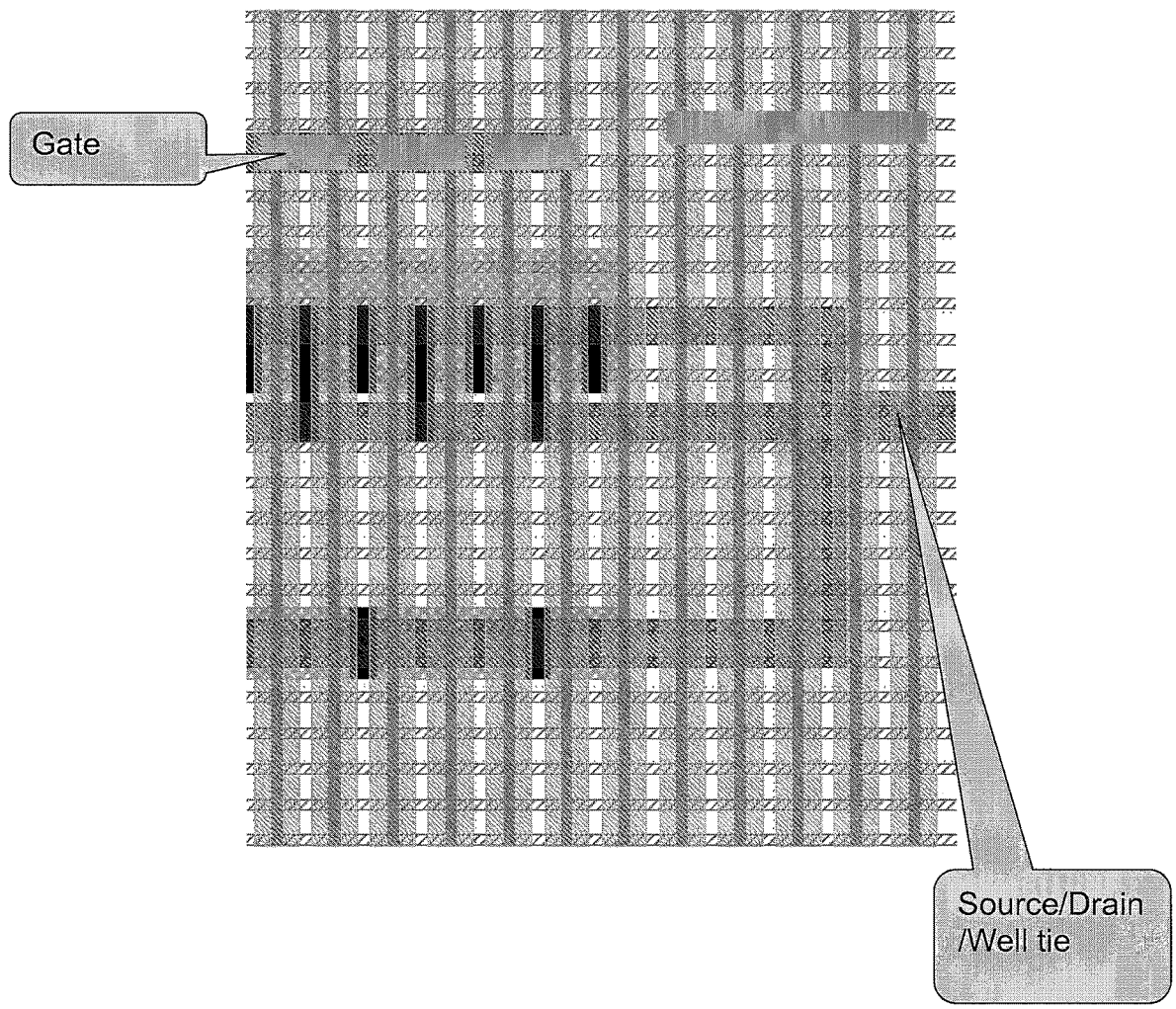
FIG. 2 illustrates a test structure with varying gate length, that is to be used for the second method of fin height extraction, according to an embodiment.
Figure 3:
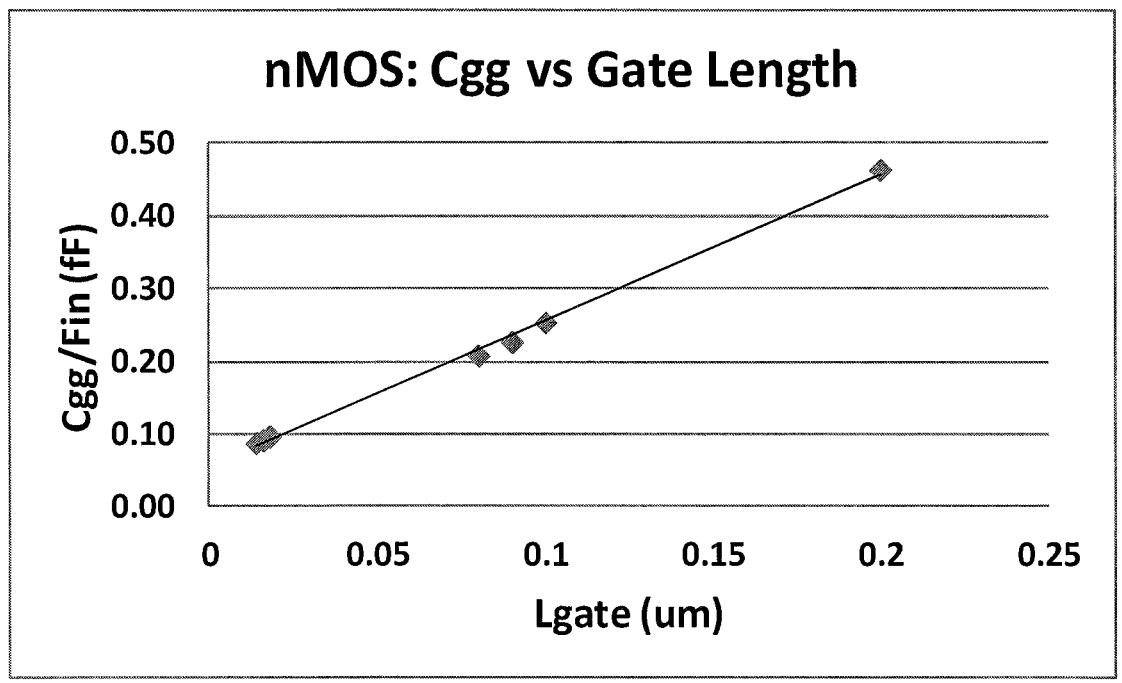
FIG. 3 illustrates the fin height extraction method using the test structure of FIG. 2.

The second method extracts fin height from total gate capacitance (Cgg) from FinFETS with different gate lengths. FIG. 2 shows a test structure (top view) with varying gate length. As shown in the graph in FIG. 3, the slope of gate capacitance Cgg versus gate length is proportional to the fin height. This measurement is for an nMOS device, but pMOS or CMOS devices may also be used. Gate bias required for nMOS devices may differ from that of pMOS devices though. This slope can directly be used as a monitor of fin height or it can be converted to a fin height whenever the gate dielectric thickness is known. This method requires a technique to measure leaky capacitors, and one such technique for such a leaky capacitor measurement is described in the co-owned U.S. Provisional Application No. 62/220,134, filed Sep. 17, 2015.

The fin height is extracted from the slope according to the following equation:

$$\text{Slope} \approx \frac{\varepsilon_{ox}}{T_{inv}}(2*h*nFins)$$

where $\varepsilon_{ox}$ is the dielectric constant of gate dielectric, $T_{inv}$ is the electrically equivalent thickness of the gate dielectric in inversion, h is the fin height, and nFins is the number of fins.

Persons skilled in the art would appreciate that FinFETs have unique challenges because of its non-planar structure. For planar devices, gate cap structures are used to estimate $T_{inv}$. This requires large W devices, which is not possible in FinFETs, because W depends on fin-height. Using the second method, gate cap structure can be used to estimate fin-height and eCD, assuming $T_{inv}$ is dictated by DRM value. For a particular batch of FinFETs, average fin height was extracted to be 39 nm. Gate bias change with gate length can increase accuracy in extraction. An alternate method may use only short gate lengths for slope.

The invention has been described in terms of particular embodiments. Other embodiments are within the scope of the following claims. For example, the steps of the invention can be performed in a different order and still achieve desirable results. While certain representative embodiments and details have been shown for purposes of illustrating the invention, it will be apparent to those skilled in the art that various changes in the methods and apparatus disclosed herein may be made without departing from the scope of the invention which is defined in the appended claims.

The invention claimed is:

1. A method for monitoring height of a fin in a FinFET device by capacitive measurement, the method comprising:
providing a structure comprising a first comb-like arrangement of a plurality of fins with no gates, and a second comb-like arrangement of a plurality of fins with no gates, wherein the first comb-like arrangement and the second comb-like arrangement are interleaved such that an individual fin of the first comb-like arrangement is adjacent to an individual fin of the second comb-like arrangement, wherein the individual fins of the first comb-like structure and the second comb-like structure are substantially of the same height;
measuring a capacitance between the two comb-like arrangements; and
using the measured capacitance to control height of the fin in the FinFET device, wherein the FinFET device uses a technology that merges a source and a drain.

2. The method of claim 1, wherein the method further comprises:
extracting the height of an individual fin from the measured capacitance using a known value of a dielectric constant of a dielectric between the fins.

3. The method of claim 1, wherein the method further comprises using the measured capacitance to control the fin height of the FinFET device during manufacture.

4. The method of claim 1, wherein an epitaxial growth is blocked for the structure as there is no gate, obviating the need for epitaxial growth for contact formation.

5. The method of claim 1, wherein the method further comprises using a second FinFET device comprising a structure having a gate, wherein gate capacitance measured from the gate of the second FinFET device is independent of the measured capacitance used for monitoring fin height, and wherein gate capacitance measured from the second FinFET device is used to determine a value of a thickness of a gate dielectric layer in the first and second FinFET devices.

6. A method for monitoring fin height in a FinFET device by capacitive measurement, the method comprising:
providing a structure comprising a plurality of FinFET devices having varying lengths of gates but having same fin height throughout the structure;
measuring gate capacitance for each FinFET device;
plotting gate capacitance versus gate length to calculate a slope value that is proportional to the fin height; and
using the measured slope to control the fin height in the FinFET devices.

7. The method of claim 6, wherein gate capacitance is measured at inversion.

8. The method of claim 6, wherein the fin height is extracted from the slope according to the following equation:

$$\text{Slope} \approx \frac{\varepsilon_{ox}}{T_{inv}}(2*h*nFins).$$

9. The method of claim 8, wherein value of $T_{inv}$ is dictated by Design Rule Manual (DRM).

10. The method of claim 6, wherein the slope is calculated-using the FinFET devices whose gate lengths are shorter than a threshold value.

11. The method of claim 6, further comprising varying a bias applied to gates of the FinFET devices based on the length of the gate.

12. The method of claim 11, wherein the bias applied is different for nMOS devices compared to pMOS devices having the same gate length.

13. A method of determining fin height for a fin field-effect transistor device (FinFET) based on capacitance measurement, the method performable during manufacturing without making process modifications, the method comprising:
in a first FinFET disposed on a semiconductor substrate, the first FinFET comprising a plurality of fins forming transistor source and drain regions, wherein a transistor gate and gate contact are excluded from the first FinFET, wherein the first FinFET comprises a structure having a first comb-like configuration of parallel fins interleaved with a second comb-like configuration of parallel fins, wherein each individual fin of the first comb-like configuration of parallel fins is disposed on the semiconductor substrate adjacent to at least one individual fin of the second comb-like configuration of parallel fins, and wherein individual fins of the first and second comb-like structures are substantially of the same fin height;

measuring a fin-to-fin capacitance between adjacent fins of the plurality of fins in the first and second comb-like structures; and using the measured fin-to-fin capacitance to determine fin height for the first FinFET.

14. The method of claim 13 further comprising:

in a test structure comprising a second FinFET comprising a transistor gate and gate contact and a plurality of parallel fins forming transistor source drain regions of the second FinFET:

measuring a gate capacitance of the second FinFET, wherein the gate capacitance of the second FinFET is measured independently from measuring the fin-to-fin capacitance of the first FinFET; and determining a gate dielectric layer thickness for the transistor gate of the second FinFET based on the measured gate capacitance.

15. A method for determining fin height in a fin field-effect transistor device (FinFET) based on capacitance measurement, the method performable during manufacturing without making process modifications, the method comprising:

in a structure disposed on a semiconductor substrate embracing (1) a first FinFET comprising a plurality of fins forming transistor source drain regions and a transistor gate of a first gate length and (2) a second FinFET comprising a plurality of fins forming transistor source drain regions and a transistor gate of a second gate length different from the first gate length, wherein fin height for the plurality of fins in the first and second FinFETs is substantially the same throughout the structure:

measuring gate capacitance of the first FinFET and gate capacitance of the second FinFET;

calculating the slope of gate capacitance versus gate length for the first gate length and measured gate capacitance of the first FinFET and for the second gate length and measured gate capacitance of the second FinFET; and determining fin height for the first FinFET and the second FinFET based on the calculated slope.

16. The method of claim 15 wherein the fin height is determined from the slope according to the following equation:

$$\text{Slope} \approx \frac{\varepsilon_{ox}}{T_{inv}}(2*h*nFins)$$

where $\varepsilon_{ox}$ is the dielectric constant of gate dielectric, $T_{inv}$ is the electrically equivalent thickness of the gate dielectric in inversion, h is the fin height, and nFins is the number of fins.

* * * * *